United States Patent
Hsu et al.

(10) Patent No.: US 10,601,427 B1
(45) Date of Patent: Mar. 24, 2020

(54) CLOCK GENERATING DEVICE AND CLOCK GENERATING METHOD

(71) Applicant: Realtek Semiconductor Corporation, Hsinchu (TW)

(72) Inventors: Chia-Kuei Hsu, Hsinchu County (TW); Ming-Kai Chuang, New Taipei (TW); Mei-Chuan Lu, Taichung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/508,495

(22) Filed: Jul. 11, 2019

(30) Foreign Application Priority Data

Nov. 9, 2018 (TW) .............................. 107139949 A

(51) Int. Cl.
*H03K 23/68* (2006.01)
*H03L 7/081* (2006.01)
*H03K 19/20* (2006.01)

(52) U.S. Cl.
CPC ............ *H03K 23/68* (2013.01); *H03K 19/20* (2013.01); *H03L 7/081* (2013.01)

(58) Field of Classification Search
CPC .. H03K 23/64–68; H03K 19/20; H03K 19/21; H03K 19/212; H03K 19/215; H03K 19/217; H03K 19/23; H03L 7/081; H03L 7/0812; H03L 7/0814; H03L 7/0816; H03L 7/0818
See application file for complete search history.

(56) References Cited

U.S. PATENT DOCUMENTS

| | | | | |
|---|---|---|---|---|
| 4,606,059 A * | 8/1986 | Oida | .................... | H03K 23/667 377/108 |
| 4,651,334 A * | 3/1987 | Hayashi | ................. | H03K 23/66 327/114 |
| 5,878,101 A * | 3/1999 | Aisaka | .................... | H03L 7/193 377/47 |
| 6,392,455 B1 * | 5/2002 | Yarborough, Jr. | ........ | G06F 7/68 327/115 |

* cited by examiner

*Primary Examiner* — Patrick C Chen
(74) *Attorney, Agent, or Firm* — Locke Lord LLP; Tim Tingkang Xia, Esq.

(57) ABSTRACT

A clock generating device includes a divisor register, a reference clock generator, a first counter, a second counter, and a delay regulator circuit. The divisor register provides a divisor. The reference clock generator outputs a reference clock signal. The first counter counts a first number of cycles of the reference clock signal and generates a first count. The first counter outputs a first clock signal according to the first count and the divisor. The second counter counts a second number of cycles of the first clock signal and generates a second count. The second counter outputs a second clock signal according to the second count and a coefficient. The delay regulator circuit determines whether to control the first counter to delay outputting the first clock signal according to the first clock signal.

20 Claims, 3 Drawing Sheets

CLOCK GENERATING DEVICE AND CLOCK GENERATING METHOD

CROSS-REFERENCE TO RELATED APPLICATION

This application claims priority to Taiwan Application Serial Number 107139949, filed on Nov. 9, 2018, which is herein incorporated by reference.

BACKGROUND

Technical Field

The disclosure relates to an electronic device and a method. More particularly, the disclosure relates to a clock generating device and a clock generating method.

Description of Related Art

In electronic and communication fields, Baud rate generator transforms a high-speed oscillator into a low-speed Baud rate. The high-speed oscillator can be the RC/LC oscillator circuits or the quartz crystal oscillators for more accurate and higher frequency. The Baud rate generator is applied for data serial transmissions, transformation between serial and parallel communications, such as the universal asynchronous receiver-transmitter (DART).

In the asynchronous serial interface communications, the Baud rate of the receiver device and that of the transmitter device have to be set approximately the same with each other, so that the receive/transmitter device receives/transmits data correctly. However, in a general transmission process, it is difficult to set the Baud rate of the receiver/transmitter to be similar with each other, which results in data reception/transmission errors.

SUMMARY

Some aspects of the present disclosure are to provide a clock generating device. The clock generating device includes a divisor register, a reference clock generator, a first counter, a second counter, and a delay regulator circuit. The divisor register provides a divisor. The reference clock generator outputs a reference clock signal. The first counter counts a first number of cycles of the reference clock signal and generates a first count accordingly. The first counter outputs a first clock signal according to the first count and the divisor. The second counter counts a second number of cycles of the first clock signal and generates a second count accordingly. The second counter outputs a second clock signal according to the second count and a coefficient. The delay regulator circuit determines whether to control the first counter to delay outputting the first clock signal according to the first clock signal.

Some aspects of the present disclosure are to provide a clock generating method of a clock generating device, in which the clock generating device includes a reference clock generator, and the reference clock generator outputs a reference clock signal. The clock generating method includes the following steps: counting a first number of cycles of the reference clock signal to generate a first count, and outputting a first clock signal according to the first count and a divisor; counting a second number of cycles of the first clock signal to generate a second count, and outputting a second clock signal according to the second count and a coefficient; and determining whether to delay outputting the first clock signal according to the first clock signal.

DETAILED DESCRIPTION

Reference is now made in detail to the present embodiments of the disclosure, examples of which are illustrated in the accompanying drawings.

Figure 1:
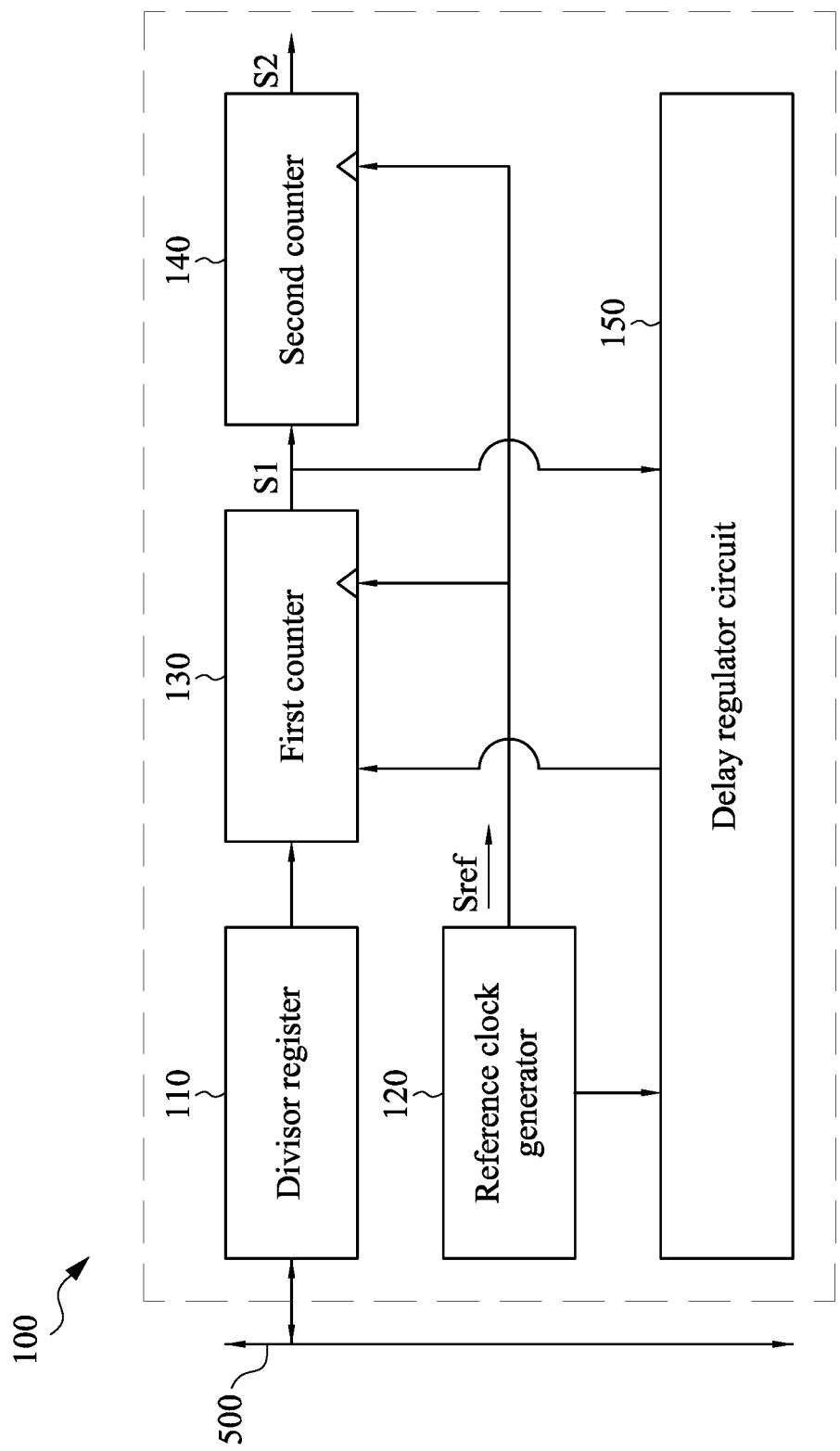
FIG. 1 is a schematic diagram of a clock generating device according to some embodiments of the present disclosure.

FIG. 1 is a schematic diagram of a clock generating device 100 according to some embodiments of the present disclosure. The clock generating device 100 includes a divisor register 110, a reference clock generator 120, a first counter 130, a second counter 140, and a delay regulator circuit 150. With regard to connection relations, the clock generating device 100 is connected to a system through a system bus 500. The divisor register 110 is coupled to the first counter 130. The first counter 130 is coupled to the second counter 140. The reference clock generator 120 is coupled to the first counter 130 and the second counter 140. The delay regulator circuit 150 is coupled to the reference clock generator 120 and the first counter 130.

With regard to operations, the reference clock generator 120 outputs a reference clock signal Sref. For example, the reference clock generator 120 outputs a pulse every few microseconds (μs) to serve as the reference clock signal Sref. In other words, the reference clock signal Sref can be treated as a periodic signal. The divisor register 110 provides a divisor to the first counter 130. The first counter 130 counts the number of cycles of the reference clock signal Sref (such as counting the number of pulses or the number of rising edges of the reference clock signal Sref), and generates a first count. If the divisor provided by the divisor register 110 is 3, the first counter 130 outputs a pulse served as a first clock signal S1 when the first count of the first counter 130 is 3. In some embodiments, after the first counter 130 counts 3 cycles of the reference clock Sref generated by the reference clock generator 120, the first counter 130 outputs a pulse served as the first clock signal S1.

The second counter 140 receives a coefficient which is set previously, and the second counter 140 counts a number of cycles of the first clock signal S1 (such as the number of pulses or the number of rising edges of the first clock signal S1) to generate a second count. When the second count is equal to the coefficient, the second counter 140 outputs a pulse served as the second clock signal S2. In some embodiments, after the second counter 140 counts 3 cycles of the first clock signal S1, the first counter 130 outputs a pulse served as the first clock signal S1.

In some embodiments, a duty cycle of each of the reference clock signal Sref, the first clock signal S1, and the second clock signal S2 is less than 100%.

In some embodiments, after the first count of the first counter 130 is equal to the divisor, the first count is reset and starts to recount. In some embodiments, after the second count of the second counter 140 is equal to the coefficient, the second count will be recounted. For example, if the divisor is 3, the first count will be 1, 2, 3, 1, 2, 3, ..., etc.

The delay regulator circuit 150 determines whether to control the first counter 130, according to the first clock signal S1, to delay outputting the first clock signal S1. If the delay regulator circuit 150 determines that the first clock signal S1 should be regulated, the delay regulator circuit 150 outputs a delay control signal to the first counter 130. At this time, the first counter 130 delays outputting the first clock signal S1 correspondingly, and the second counter 140 receives the first clock signal S1 which is delayed. Because the second counter 140 outputs the second clock signal S2 according to counting, by the second counter 140, the number of cycles of the first clock signal S1, the time of outputting the second clock signal S2 is delayed correspondingly.

In some embodiments, when the first counter 130 delays outputting the first clock signal S1, the first counter 130 delays counting in a counting cycle. For example, if the divisor provided by the divisor register 110 is 3, a normal counting series of the first counter 130 is 1, 2, 3, and a delayed counting series of the first counter 130 is 1, 1, 2, 3.

For example, the clock rate, e.g., Baud rate, generated by the clock generating device 100 in FIG. 1 is shown in equation 1.

$$BaudRate = \frac{(\text{reference } clk \text{ rate})}{k \times \left(\text{Divisor} + \frac{\text{Delay addition}}{k}\right)} \quad \text{equation 1}$$

The clock generating device 100 shown in FIG. 1 can be, but not limited to, the Baud rate generator. In equation 1, "BaudRate" is the frequency of the second clock signal S2 which the clock generating device 100 outputs, "reference clk rate" is the frequency of the reference clock signal Sref which the reference clock generator 120 provides, "k" is the coefficient compared with the second count (by the second counter 140), "Divisor" is the divisor which the divisor register 110 provides, and "Delay addition" is the number of delays of the first clock signal S1 which the counter 130 outputs.

For example, k is 16, the target Baud Rate is 921600 bps, and the reference clock rate is 50 MHz. In the case where no Delay addition is provided by the delay regulator circuit 150 of the present disclosure, the divisor provided by the divisor register 110 is shown in equation 2.

$$\text{Divisor Register} = \text{integer}\left(\frac{50{,}000{,}000}{16 \times 921600}\right) = 3 \quad \text{equation 2}$$

In equation 2, "Divisor Register" is the value stored in the divisor register 110. According to equation 2, the required value of the divisor is 3. After the divisor is substituted into equation 1, the Baud rate is:

$$BaudRate = \left(\frac{50{,}000{,}000}{16 \times 3}\right) \cong 1041667$$

As shown above, Baud rate is about 1041667 bps, the difference between the Baud rate value and a target Baud rate (i.e., error rate of the Baud rate), 921600 bps, is 13.02%. However, if the Delay addition is provided by the delay regulator circuit 150 of the disclosure, the error rate of the Baud rate is decreased. The computation of Delay addition is shown below.

First, calculate the divisor and its decimals:

$$\left(\frac{50{,}000{,}000}{16 \times 921600}\right) \cong 3.39$$

Then, calculate the Delay addition(the number of delays):

Delay addition=integer(0.39×16+0.5)=6      equation 3

As shown in equation 3, the computation of Delay addition considers the decimals, in which 0.39 is multiplied by k of the Baud Rate generator, and the product is added by 0.5 for the integer function to round off the decimal. After the Delay addition is obtained, the Baud rate is calculated by equation 1 as the following:

$$BaudRate = \left(\frac{50{,}000{,}000}{16 \times \left(3 + \frac{6}{16}\right)}\right) = 925926$$

As shown above, the Baud rate is 925926 bps, and the difference between the Baud rate value and the target Baud rate, 921600 bps, (error rate) is merely 0.47%. The error rate of the outputted Baud rate is substantially decreased.

Therefore, in the present disclosure, the delay regulator circuit 150 provides the delay control signal which results in the second clock signal S2 delayed as well, and then the clock generating device 100 outputs the Baud rate with the minimal error rate.

Figure 2:
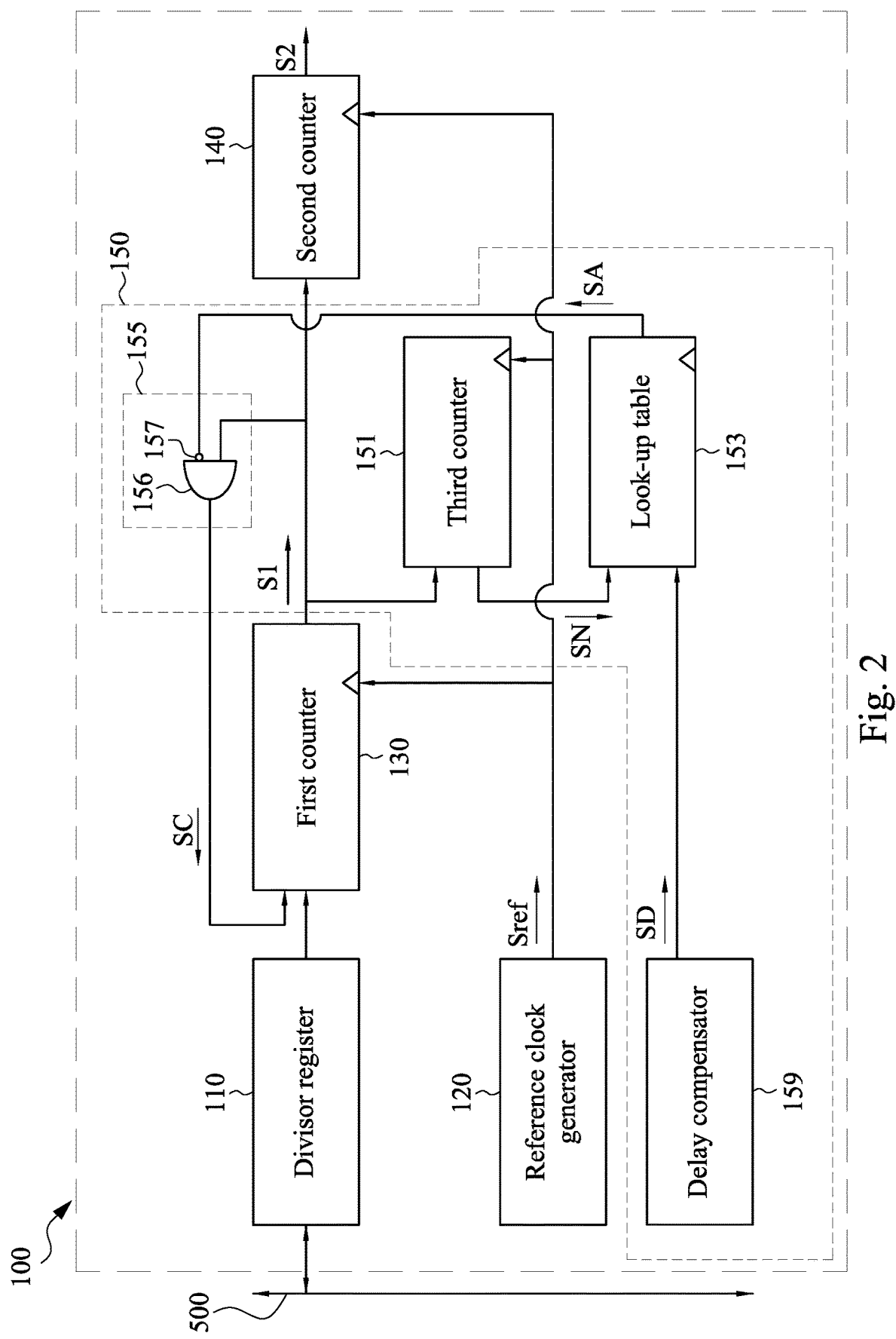
FIG. 2 is a schematic diagram of the clock generating device according to some embodiments of the present disclosure.

FIG. 2 is a schematic diagram of the clock generating device 100 according to some embodiments of the present disclosure. FIG. 2 shows exemplary of detailed elements of the delay regulator circuit 150 in FIG. 1 as one of embodiments, but the present disclosure is not limited herein. It should be noted that, the connections and operations among the divisor register 110, the reference clock generator 120, the first counter 130, and the second counter 140 are illustrated in FIG. 1, and there is no necessity for repetition.

As shown in FIG. 2, the delay regulator circuit 150 includes a third counter 151, a look-up table 153, a logic gate 155, and a delay compensator 159. With regard to the connections, the third counter 151 is coupled to the first counter 130, the look-up table 153, and the reference clock generator 120. The look-up table 153 is stored in a memory (not shown) of the delay regulator circuit 100, or in other storage medias, in which the memory or another storage media is coupled to a delay compensator 159 and a logic gate 155. The logic gate 155 is coupled to the first counter 130.

With regard to operations, the third counter 151 counts the first clock signal S1 to output a serial number SN corresponding to the first clock signal S1. The delay regulator circuit 100 searches the look-up table 153 according to the serial number SN and the number of delays SD outputted by the delay compensator 159, in order to output the delay regulating signal SA. After the logic gate 155 receives the delay regulating signal SA, the logic gate 155 outputs the delay control signal SC according to the level of the first clock signal S1 and the level of the delay regulating signal SA. When the first counter 130 receives the delay control signal SC, the first counter 130 delays outputting the first clock signal S1 according to the delay control signal SC. Correspondingly, the second counter 140 outputs the second clock signal S2 according to the delayed first clock signal S1.

In some embodiments, when the first count is equal to the divisor, the first counter 130 outputs a pulse. At this time, the first counter 130 determines whether to delay outputting the first clock signal S1 according to the delay control signal SC.

For example, the contents of the look-up table are shown as below.

|    | 15 | 14 | 13 | 12 | 11 | 10 | 9 | 8 | 7 | 6 | 5 | 4 | 3 | 2 | 1 | 0 |
|----|----|----|----|----|----|----|---|---|---|---|---|---|---|---|---|---|
| 0  | 0  | 0  | 0  | 0  | 0  | 0  | 0 | 0 | 0 | 0 | 0 | 0 | 0 | 0 | 0 | 0 |
| 1  | 0  | 0  | 0  | 0  | 0  | 0  | 0 | 0 | 0 | 0 | 0 | 0 | 0 | 0 | 0 | 1 |
| 2  | 0  | 0  | 0  | 0  | 0  | 0  | 0 | 1 | 0 | 0 | 0 | 0 | 0 | 0 | 0 | 1 |
| 3  | 0  | 0  | 0  | 1  | 0  | 0  | 0 | 0 | 0 | 1 | 0 | 0 | 0 | 0 | 0 | 1 |
| 4  | 0  | 0  | 0  | 1  | 0  | 0  | 0 | 1 | 0 | 0 | 0 | 1 | 0 | 0 | 0 | 1 |
| 5  | 1  | 0  | 0  | 1  | 0  | 0  | 0 | 1 | 0 | 0 | 0 | 1 | 0 | 0 | 0 | 1 |
| 6  | 1  | 0  | 0  | 1  | 0  | 0  | 1 | 0 | 0 | 1 | 0 | 0 | 1 | 0 | 0 | 1 |
| 7  | 1  | 0  | 0  | 1  | 0  | 0  | 1 | 0 | 0 | 1 | 0 | 0 | 1 | 0 | 1 | 1 |
| 8  | 1  | 1  | 0  | 1  | 0  | 0  | 1 | 0 | 0 | 1 | 0 | 0 | 1 | 0 | 1 | 1 |
| 9  | 1  | 1  | 0  | 1  | 0  | 0  | 1 | 0 | 0 | 1 | 0 | 0 | 1 | 1 | 1 | 1 |
| 10 | 1  | 1  | 1  | 1  | 0  | 0  | 1 | 0 | 0 | 1 | 0 | 0 | 1 | 1 | 1 | 1 |
| 11 | 1  | 1  | 1  | 1  | 0  | 0  | 1 | 0 | 0 | 1 | 1 | 0 | 1 | 1 | 1 | 1 |
| 12 | 1  | 1  | 1  | 1  | 0  | 1  | 1 | 0 | 0 | 1 | 1 | 0 | 1 | 1 | 1 | 1 |
| 13 | 1  | 1  | 1  | 1  | 0  | 1  | 1 | 0 | 0 | 1 | 1 | 1 | 1 | 1 | 1 | 1 |
| 14 | 1  | 1  | 1  | 1  | 1  | 1  | 1 | 0 | 0 | 1 | 1 | 1 | 1 | 1 | 1 | 1 |
| 15 | 1  | 1  | 1  | 1  | 1  | 1  | 1 | 0 | 1 | 1 | 1 | 1 | 1 | 1 | 1 | 1 |

As shown above, the row indices of the table, from up to down, are row 0 to row 15, and the column indices, from right to left, are column 0 to column 15. The number of delays SD outputted by the delay compensator 159 corresponds to the row index of the look-up table 153, and the serial number SN outputted by the third counter 151 corresponds to the column index of the look-up table 153. For example, when the number of delays SD is 6 and the serial number SN is 0, the value at the 6th row and the 0th column of the look-up table 153 is 1. The value "1" is regarded as the delay regulating signal SA. The value "1" is outputted to the NOT gate 157 of the logic gate 155 by the look-up table 153. The NOT gate 157 converts the level of the delay regulating signal SA from "1" to "0", and provides the value "0" to the AND gate 156 of the logic gate 155. In addition, the AND gate 156 receives the first clock signal S1. When the first count is equal to the value of the divisor, the first clock signal S1 outputted by the first counter 130 is served as the pulse signal, and the level of the first clock signal S1 is "1". Hence, the AND gate 156 receives the delay regulating signal SA whose level is "0" and the first clock signal S1 whose level is "1". After the AND gate 156 logically compares the two received signals, the AND gate 156 outputs the delay control signal SC whose level is "0" to the first counter 130. The first counter 130 delays outputting the first clock signal S1. In some embodiments, the logic gate 155, which can be the NOT gate 157, receives the delay regulating signal SA and outputs the delay control signal SC. Correspondingly, after it is determined that the first count is equal to the value of the divisor, the first counter 130 determines whether to delay the first clock signal S1 according to the output value of the logic gate 155.

Similarly, when the serial numbers SN are 3, 6, 9, 12, and 15, the level of the delay regulating signal SA outputted from the look-up table 153 are all "1". With the same logic computations, the first counter 130 receives the delay control signal SC whose level is "0". Hence, the first counter 130 will delay outputting the first clock signal S1 when the serial numbers SN are 0, 3, 6, 9, 12, and 15. Therefore, the delay regulator circuit 150 provides the delay regulating signal SA, and in the case that the clock generating device 100 is the Baud rate generator, the equation 1 can be applied by the clock generating device 100 for generating the precise Baud rate. In addition, if the level of the delay regulating signal SA provided by the look-up table 153 is "0", the first counter 130 receives the delay control signal SC whose level is "1" with the same logic computations as mentioned previously. At this time, the first counter 130 does not delay outputting the first clock signal S1.

In some embodiments, the levels of the delay regulating signal SA and the delay control signal SC are not limited to the above embodiments. For example, the delay regulating signal SA whose level is "0" or the delay control signal SC whose level is "1" makes the first counter 130 delay outputting the first clock signal S1 according to different configurations of the logic gate 155 or of the first counter 130.

In some embodiments, the number of delays SD is calculated in advance, and is set as a default delay value. The delay regulator circuit 150 searches the look-up table 153 according to the serial number SN of the first clock signal, in order to output the delay control signal SC. In some embodiments, the delay regulator circuit 150 does not include the logic gate 155. For example, the delay regulator circuit 150 searches the look-up table 153 according to the serial number SN of the first clock signal, and outputs the delay regulating signal SA served as the delay control signal SC. After the first counter 130 determines that the first count is equal to the value of the divisor, the first clock signal S1 is determined whether to be delayed according to the output signal of the logic gate 155.

Figure 3:
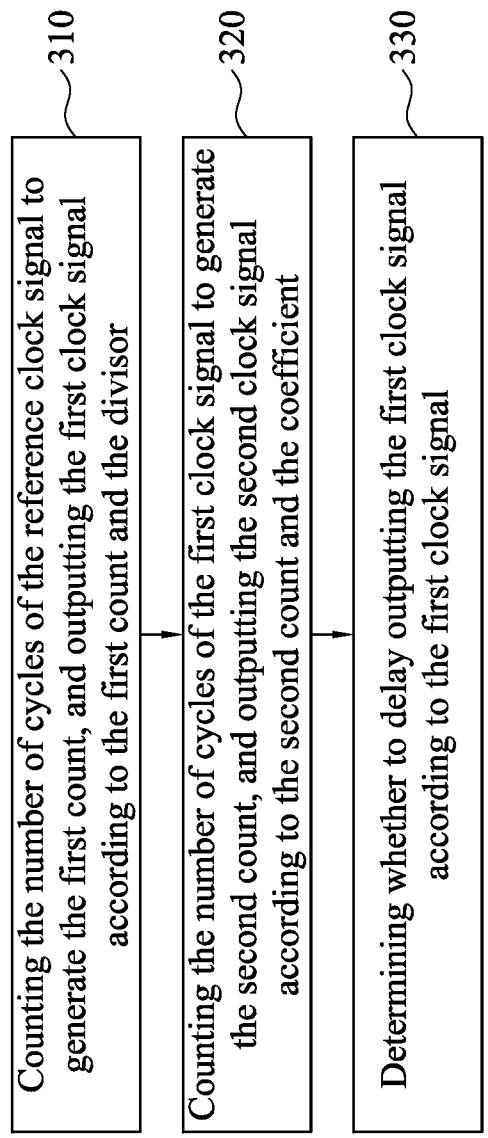
FIG. 3 is a flow chart of a clock generating method according to some embodiments of the present disclosure.

FIG. 3 is a flow chart of a clock generating method according to some embodiments of the present disclosure. The clock generating method includes the following steps.

In step 310: counting the number of cycles of the reference clock signal to generate the first count, and outputting the first clock signal according to the first count and the divisor;

In step 320: counting the number of cycles of the first clock signal to generate the second count, and outputting the second clock signal according to the second count and the coefficient; and In step 330: determining whether to delay outputting the first clock signal according to the first clock signal.

For facilitating the understanding of the clock generating method shown in FIG. 3, please refer to FIG. 3 and FIG. 1. In step 310, the first counter 130 outputs the first count according to counting, by the first counter 130, the number of cycles of the reference clock signal Sref, and the first clock signal S1 is outputted according to the first count and the divisor. In step 320, the second count is generated by the second counter 140 according to the number of cycles of the first clock signal S1 counted by the second counter 140, and the second clock signal S2 is outputted according to the second count and the coefficient. In step 330, the clock signal S1 is determined whether to be delayed outputting by the delay regulator circuit 150 according to the first clock signal S1.

In one embodiment, when the first count is equal to the value of the divisor, a pulse is outputted by the first counter 130 and the pulse is served as the first clock signal S1. In the other embodiment, when the second count is equal to the coefficient, a pulse is outputted by the second counter 140 and the pulse is served as the second clock signal S2.

In another embodiment, refer to FIG. 2 and FIG. 3, the number of cycles of the first clock signal S1 is counted by the third counter 151, and the serial number SN corresponding to the first clock signal S1 is outputted. In another embodiment, the look-up table 153 is searched according to the serial number SN of the first clock signal S1, and the delay regulating signal SA is outputted accordingly.

In another embodiment, the delay control signal SC is outputted according to the level of the first clock signal S1 and the level of the delay regulating signal SA received by the logic gate 155. In one embodiment, the first counter 130 receives the delay control signal SC, and the first clock signal S1 is delayed to be outputted according to the delay control signal SC. In another embodiment, the second counter 140 receives the delayed first clock signal S1, and the second clock signal S2 is outputted according to the delayed first clock signal S1.

In one embodiment, the number of delays SD of the first clock signal S1 is determined, by the delay compensator 159. In another embodiment, the default level signal is searched from the look-up table 153 according to the number of delays SD and the serial number SN corresponding to the first clock signal S1. If the default level signal is the first level, the look-up table 153 outputs the delay regulating signal SA with high (low) level. If the default level signal is the second level, the look-up table 153 outputs the delay regulating signal SA with the low (high) level.

According to the above embodiments, the present disclosure has the following merits. The clock generating device and the clock generating method in the present disclosure make the Baud rates of receiver/transmitter be set approximately the same with each other in transmission process, and the accuracy of transmitting and receiving data is increased accordingly.

What is claimed is:

1. A clock generating device, comprising:
a divisor register, configured to provide a divisor;
a reference clock generator, configured to output a reference clock signal;
a first counter, configured to count a first number of cycles of the reference clock signal to generate a first count, and to output a first clock signal according to the first count and the divisor;
a second counter configured to count a second number of cycles of the first clock signal to generate a second count, and to output a second clock signal according to the second count and a coefficient; and
a delay regulator circuit configured to determine whether to control the first counter to delay outputting the first clock signal according to the first clock signal.

2. The clock generating device of claim 1, wherein when the first count is equal to a value of the divisor or after it is determined that the first count is equal to the value of the divisor, the first counter outputs a pulse served as the first clock signal.

3. The clock generating device of claim 1, wherein when the second count is equal to the coefficient or after it is determined that the second count is equal to the coefficient, the second counter outputs a pulse served as the second clock signal.

4. The clock generating device of claim 1, wherein the delay regulator circuit comprises:
a third counter, configured to count the first clock signal to output a serial number corresponding to the first clock signal, wherein the delay regulator circuit determines, according to the serial number of the first clock signal, whether to control the first counter to delay outputting the first clock signals.

5. The clock generating device of claim 4, wherein the delay regulator circuit further comprises:
a look-up table, wherein the delay regulator circuit searches the look-up table according to the serial number of the first clock signal in order to output a delay control signal.

6. The clock generating device of claim 5, wherein the delay regulator circuit further comprises:
a logic gate configured to receive a delay regulating signal, and to output the delay control signal according to the delay regulating signal, wherein the delay regulator circuit searches the look-up table according to the serial number of the first clock signal in order to output the delay regulating signal.

7. The clock generating device of claim 6, wherein the logic gate comprises:
a NOT gate configured to receive the delay regulating signal outputted from the look-up table, and to regulate the delay regulating signal from a first level to a second level; and
an AND gate, comprising:
a first input terminal, coupled to the NOT gate, wherein the first input terminal is configured to receive the delay regulating signal which is at the second level; and
a second input terminal configured to receive the first clock signal;
wherein the AND gate outputs the delay control signal according to the delay regulating signal which is at the second level and a pulse of the first clock signal.

8. The clock generating device of claim 5, wherein the delay regulator circuit further comprises:
a delay compensator configured to determine a number of delays that the first counter delays outputting the first clock signal, wherein the delay regulator circuit searches the look-up table according to the serial number of the first clock signal and the number of delays in order to output the delay control signal.

9. The clock generating device of claim 5, wherein the first counter delays outputting the first clock signal according to the delay control signal.

10. The clock generating device of claim 1, wherein the delay regulator circuit further comprises:
a delay compensator configured to determine a number of delays that the first counter delays outputting the first clock signal, wherein the delay regulator circuit determines, according to the first clock signal and the number of delays, whether to control the first counter to delay outputting the first clock signal.

11. A clock generating method, suitable for a clock generating device, wherein the clock generating device comprises a reference clock generator, and the reference clock generator outputs a reference clock signal, wherein the clock generating method comprises:
counting a first number of cycles of the reference clock signal to generate a first count, and outputting a first clock signal according to the first count and a divisor;
counting a second number of cycles of the first clock signal to generate a second count, and outputting a second clock signal according to the second count and a coefficient; and
determining whether to delay outputting the first clock signal according to the first clock signal.

12. The clock generating method of claim 11, wherein the step of outputting the first clock signal according to the first count and the divisor comprises:

outputting a pulse served as the first clock signal when the first count is equal to a value of the divisor or after it is determined that the first count is equal to the value of the divisor.

13. The clock generating method of claim 11, wherein the step of outputting the second clock signal according to the second count and the coefficient comprises:

outputting a pulse served as the second clock signal when the second count is equal to the coefficient or after it is determined that the second count is equal to the coefficient.

14. The clock generating method of claim 11, further comprising:

counting the second number of cycles of the first clock signal to output a serial number corresponding to the first clock signal, wherein the step of determining whether to delay outputting the first clock signal according to the first clock signal comprises:
  determining whether to delay outputting the first clock signal according to the serial number of the first clock signal.

15. The clock generating method of claim 14, further comprising:

searching a look-up table according to the serial number of the first clock signal in order to output a delay control signal.

16. The clock generating method of claim 15, wherein the step of outputting the delay control signal according to the serial number of the first clock signal further comprises:

searching the look-up table according to the serial number of the first clock signal in order to output a delay regulating signal; and outputting the delay control signal according to the delay regulating signal.

17. The clock generating method of claim 16, wherein the step of outputting the delay control signal according to the delay regulating signal further comprises:

regulating the delay regulating signal from a first level to a second level; and outputting the delay control signal according to the delay regulating signal at the second level and a pulse of the first clock signal.

18. The clock generating method of claim 15, further comprising:

determining a number of delays for delaying outputting the first clock signal, wherein the step of determining whether to delay outputting the first clock signal according to the first clock signal further comprises:
  searching the look-up table according to the serial number of the first clock signal and the number of delays in order to output the delay control signal.

19. The clock generating method of claim 15, further comprising:

delaying outputting the first clock signal according to the delay control signal.

20. The clock generating method of claim 11, further comprising:

determining a number of delays for delaying outputting the first clock signal, wherein the step of determining whether to delay outputting the first clock signal according to the first clock signal further comprises:
  determining whether to delay outputting the first clock signal according to the first clock signal and the number of delays.

* * * * *